(12) United States Patent
Hattori

(10) Patent No.: US 8,598,983 B2
(45) Date of Patent: Dec. 3, 2013

(54) TRANSCEIVER AND ELECTRONIC KEY INCLUDING TRANSCEIVER

(75) Inventor: Takayuki Hattori, Obu (JP)

(73) Assignee: Denso Corporation, Kariya (JP)

( * ) Notice: Subject to any disclaimer, the term of this patent is extended or adjusted under 35 U.S.C. 154(b) by 820 days.

(21) Appl. No.: 12/658,354

(22) Filed: Feb. 5, 2010

(65) Prior Publication Data

US 2010/0207725 A1 Aug. 19, 2010

(30) Foreign Application Priority Data

Feb. 16, 2009 (JP) ................................. 2009-033107

(51) Int. Cl.
*B60R 25/00* (2013.01)
(52) U.S. Cl.
USPC ...... 340/5.72; 340/572.7; 340/5.61; 343/725; 343/867
(58) Field of Classification Search
USPC .......................... 340/5.72, 5.61–5.64, 426.36, 340/426.13–426.17, 572.7; 343/711–717, 343/725–728, 788, 867; 180/287; 307/10.2–10.3; 455/41.1–41.2
See application file for complete search history.

(56) References Cited

U.S. PATENT DOCUMENTS

| | | | | |
|---|---|---|---|---|
| 4,750,000 | A * | 6/1988 | Schroeder | 343/853 |
| 5,231,346 | A * | 7/1993 | Gassmann | 324/95 |
| 5,767,813 | A * | 6/1998 | Verma et al. | 343/744 |
| 6,489,886 | B2 * | 12/2002 | Meier | 340/426.1 |
| 6,563,474 | B2 * | 5/2003 | Nantz et al. | 343/788 |
| 6,683,527 | B1 * | 1/2004 | Greenwood | 340/5.61 |
| 7,042,411 | B2 * | 5/2006 | Yagi et al. | 343/788 |
| 7,068,223 | B2 * | 6/2006 | Yoshida et al. | 343/700 MS |
| 7,142,413 | B2 * | 11/2006 | Sugimoto et al. | 361/679.57 |
| 8,044,875 | B2 * | 10/2011 | Nishino et al. | 343/788 |
| 2003/0001781 | A1 | 1/2003 | Konishi | |
| 2004/0061660 | A1 * | 4/2004 | Yoshida et al. | 343/788 |
| 2004/0263396 | A1 | 12/2004 | Sung | |
| 2005/0057408 | A1 * | 3/2005 | Asakura et al. | 343/711 |
| 2005/0136852 | A1 * | 6/2005 | Nakagawa et al. | 455/90.3 |
| 2006/0034243 | A1 * | 2/2006 | Hermann | 370/343 |
| 2006/0152427 | A1 | 7/2006 | Ueda et al. | |

FOREIGN PATENT DOCUMENTS

| | | |
|---|---|---|
| JP | 07-113365 | 5/1995 |
| JP | 11-068453 | 3/1999 |
| JP | 2000-031724 | 1/2000 |
| JP | 2001-274621 | 10/2001 |

(Continued)

OTHER PUBLICATIONS

Office action dated Jun. 11, 2013 in corresponding Japanese Application No. 2009-033107.

*Primary Examiner* — Mohammad Ghayour
*Assistant Examiner* — Nay Tun
(74) *Attorney, Agent, or Firm* — Harness, Dickey & Pierce, PLC

(57) ABSTRACT

A transceiver is disclosed. The transceiver includes: a circuit board; a receiving antenna mounted to the circuit board; and a transmitting antenna mounted to the receiving antenna. The receiving antenna includes: a supporter; a coil antenna having a coil wound around the supporter; a first terminal arranged on the supporter and connected with the coil antenna; and a second terminals arranged on the supporter. The transmitting antenna includes: a horizontal part extending in a direction perpendicular to a thickness direction of the circuit board; and a vertical part extending in the thickness direction of the circuit board. The vertical part is connected with the horizontal part and the second terminal.

2 Claims, 4 Drawing Sheets

(56) References Cited

FOREIGN PATENT DOCUMENTS

| JP | 2001-297918 | 10/2001 |
|----|-------------|---------|
| JP | 2002-339605 | 11/2002 |
| JP | 2003-017930 | 1/2003 |
| JP | 2003-069463 | 3/2003 |
| JP | 2003-092509 | 3/2003 |
| JP | 2005-020691 | 1/2005 |

* cited by examiner

TRANSCEIVER AND ELECTRONIC KEY INCLUDING TRANSCEIVER

CROSS-REFERENCE TO RELATED APPLICATION

The present application is based on Japanese Patent Application No. 2009-33107 filed on Feb. 16, 2009, disclosure of which is incorporated herein by reference.

BACKGROUND OF THE INVENTION

1. Field of the Invention

The present invention relates to a transceiver including a circuit board, a receiving antenna and a transmitting antenna. The present invention also relates to an electronic key including such a transceiver.

2. Description of Related Art

A transmitter including an antenna mounted to a printed circuit board has been proposed. According to Japanese Patent No. 3445644 for instance, the antenna has a conductive plate and a wiring pattern. The conductive plate has a U-shaped cross section, and the wiring pattern has such a ring shape that a part of the ring shape is opened and the wiring pattern has ends across the opened part. One end and another end of the conductive plate are electrically connected with the ends of the wiring pattern.

When a current flows in the conductive plate in a thickness direction of the printed circuit board, the transmitter transmits a polarized wave having a polarization plane parallel to the thickness direction of the printed circuit board. When a current flows in the wiring pattern and the conductive plate in a direction parallel to a surface of the printed circuit board, the transmitter transmits a polarized wave having a polarization plane parallel to the surface of the printed circuit board. The transmitter described in Japanese Patent No. 3445644 transmits an electromagnetic wave by combining the two polarized waves whose polarization planes are perpendicular to each other, thereby reducing an influence of multipath in electromagnetic wave transmission.

A radio wave key having the transmitter described in Japanese Patent No. 3445644 has a transmission function and does not have a receiving function. A radio wave key used in a smart entry system however may need to have a receiving function in addition to a transmission function. In a radio wave key used in a smart entry system, a receiving antenna is mounted on a printed circuit board to receive a signal from a vehicle. In this structure, since the receiving antenna and the transmitting antenna are mounted on the circuit board and spaced apart from each other, the printed circuit board becomes enlarged.

SUMMARY OF THE INVENTION

In view of the above, it is an objective of the present invention to provide a transceiver capable of suppressing enlargement of a circuit board. It is also an objective of the present invention to provide an electronic key including a transceiver capable of suppressing enlargement of a circuit board.

According to a first aspect of the present invention, a transceiver is provided. The transceiver includes a circuit board, a receiving antenna and a transmitting antenna. The receiving antenna is mounted to the circuit board and configured to receive a first electromagnetic wave in a first frequency band. The receiving antenna includes: a supporter; multiple coil antennas each having a coil wound around the supporter, axis directions of the multiple coil antennas being perpendicular to each other; multiple first terminals arranged on the supporter and connected with a wiring of the circuit board, the multiple first terminals being respectively connected with the multiple coil antennas; and two second terminals arranged on the supporter and connected with the wiring of the circuit board. The transmitting antenna is mounted to the receiving antenna and configured to transmit a second electromagnetic wave in a second frequency band. The transmitting antenna includes: a horizontal part extending in a direction perpendicular to a thickness direction of the circuit board; and two vertical parts each extending in the thickness direction of the circuit board and including a first vertical part and a second vertical part. One end of the first vertical part is connected with one of the two second terminals and another end of the first vertical part is connected with one end of the horizontal part. One end of the second vertical part is connected with the other of the two second terminals and another end of the second vertical part is connected with another end of the horizontal part.

According to a second aspect of the present invention, an electronic key is provided that includes the transceiver according to the first aspect. The receiving antenna of the electronic key may further include a case that receives the multiple coil antennas and the supporter, and that has an outer surface including a first outer surface part and a second outer surface part. The electronic key may further include a key plate that is provided to face the first outer surface part of the case. Two second terminals and the transmitting antenna are mounted to the second outer surface part of the case.

According to the above transceiver and the electronic key, the transmitting antenna having the horizontal part and the vertical parts is mounted not to the circuit board but to the second terminals. Therefore, size of the circuit board can be reduced by a mounting surface for the transmitting antenna, compared to a comparison example structure in which a receiving antenna and a transmitting antenna are mounted on a circuit board and spaced apart from each other.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE EXEMPLARY EMBODIMENTS

The exemplary embodiments will be described below with reference to the accompanying drawings.

Figure 1:
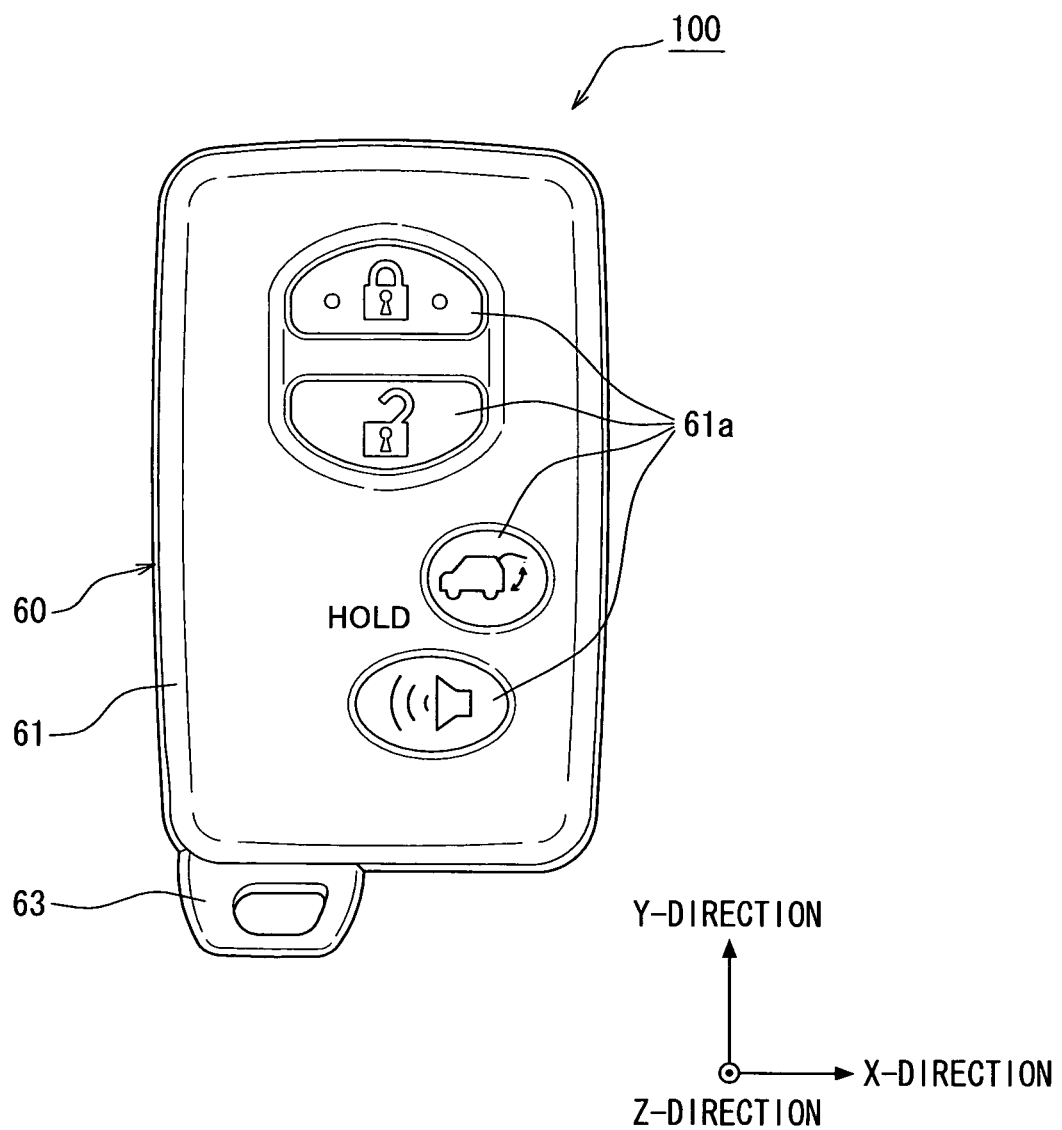
FIG. 1 is a plan view of an electronic key.
Figure 2:
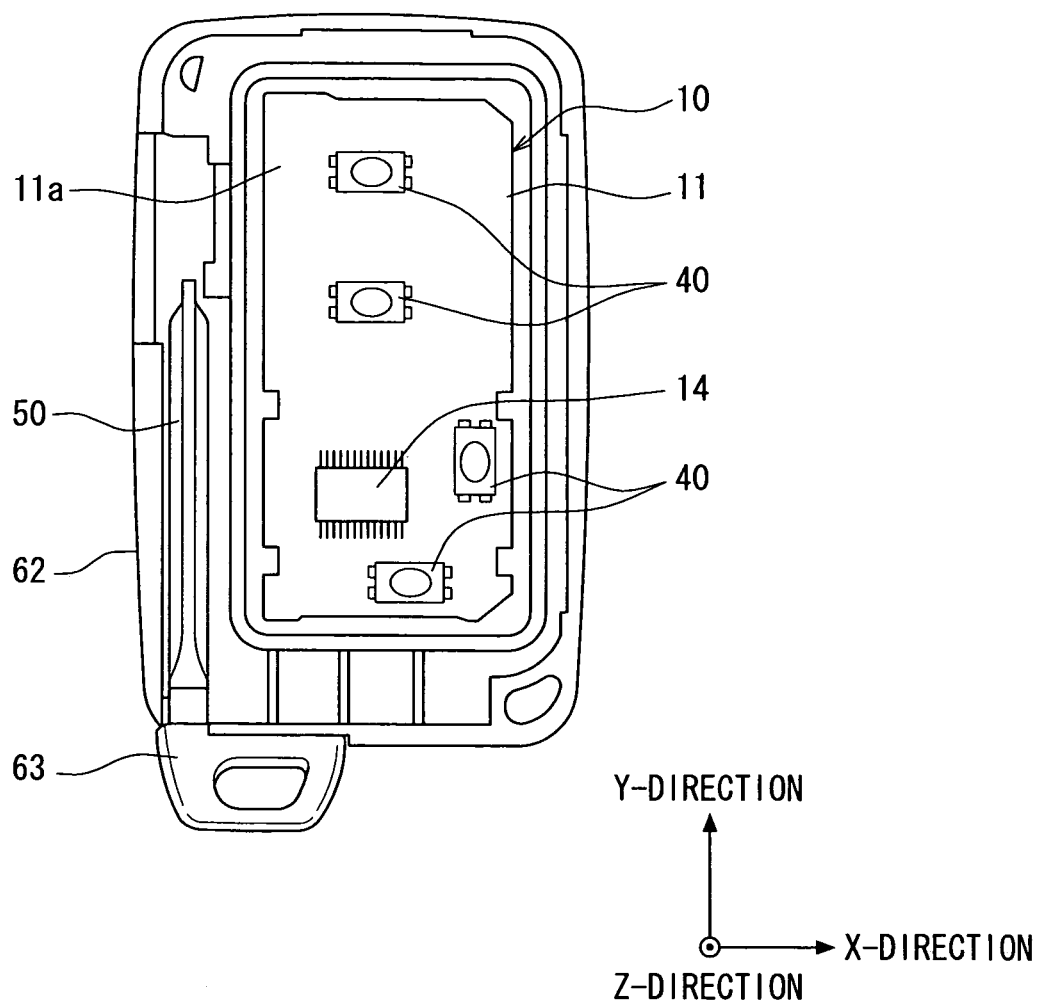
FIG. 2 is a plan view illustrating a front surface side internal configuration of the electronic key illustrated in FIG. 1.
Figure 3:
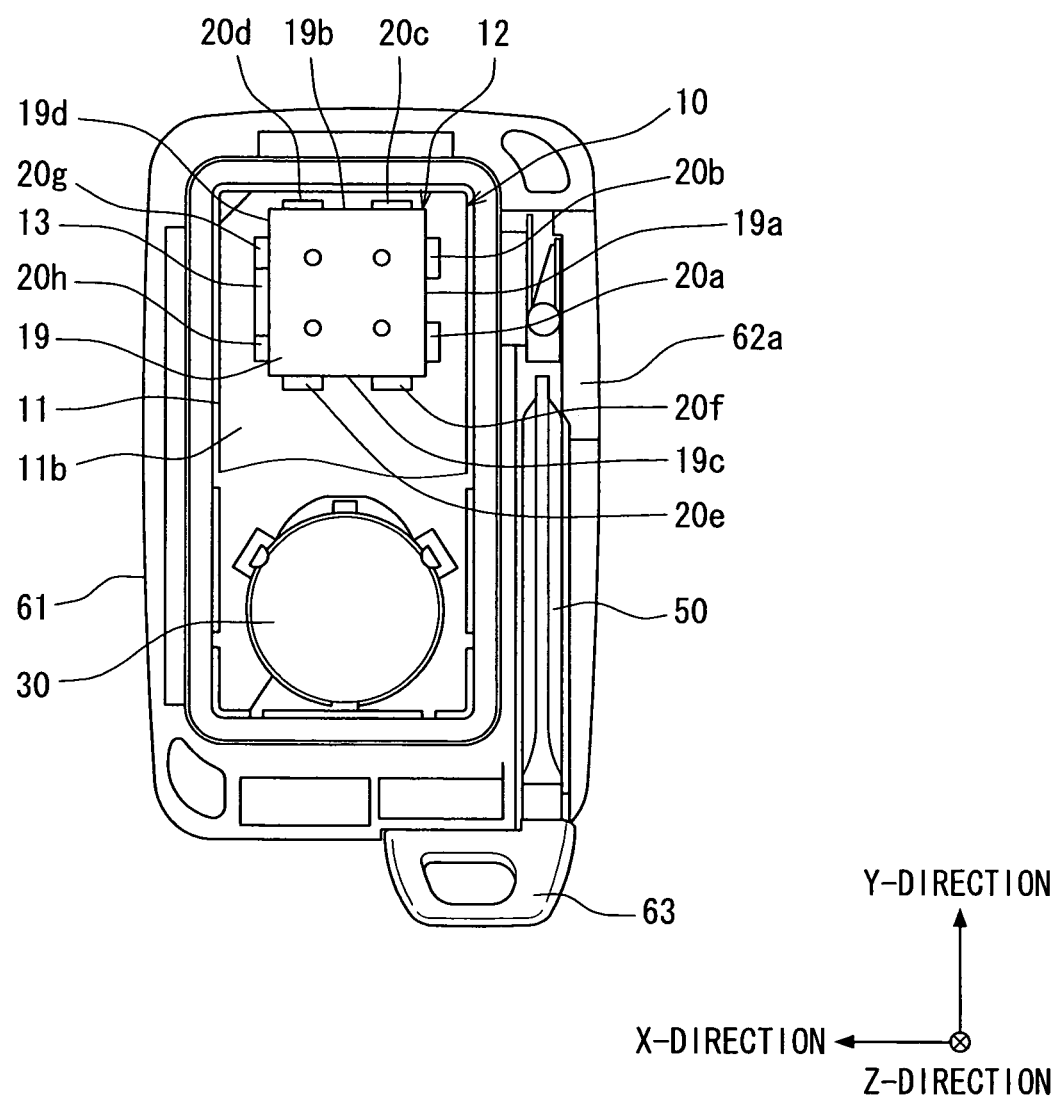
FIG. 3 is a plan view illustrating a rear surface side internal configuration of the electronic key illustrated in FIG. 1.
Figure 4:
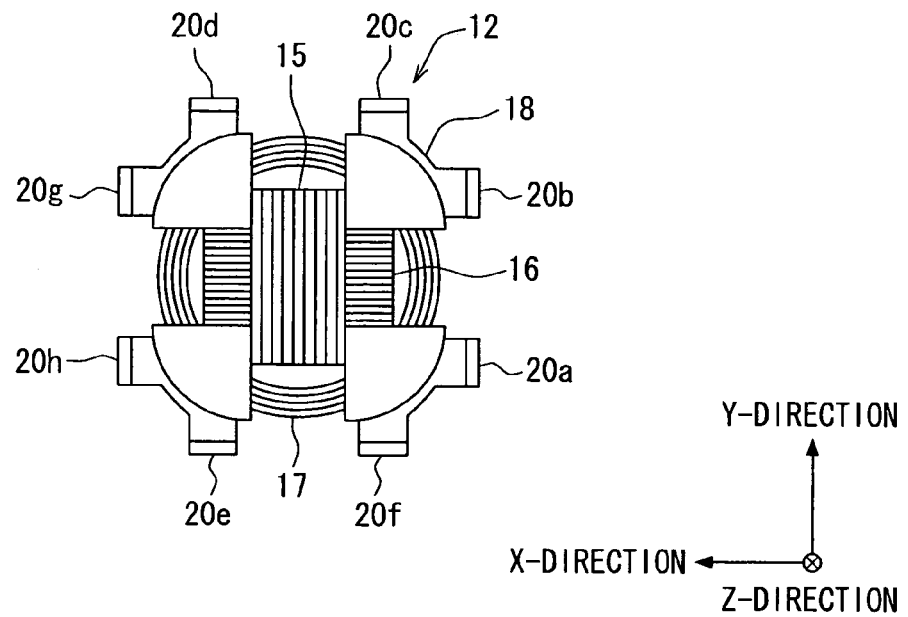
FIG. 4 is a plan view illustrating an internal configuration of a receiving antenna.
Figure 5:
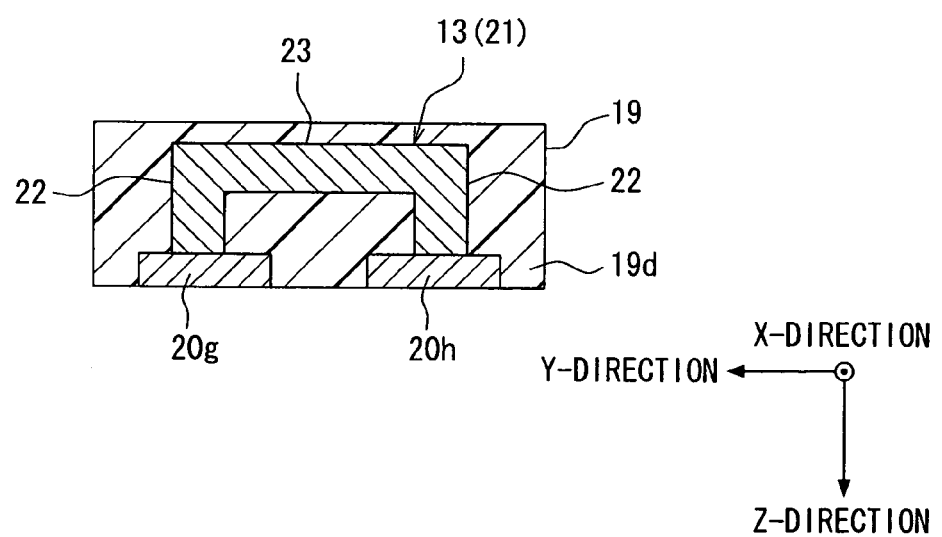
FIG. 5 is a side view illustrating the receiving antenna.

A schematic view of an electronic key 100 according to one embodiment is illustrated in FIG. 1. A front surface side internal configuration of the electronic key 100 of FIG. 1 is illustrated in FIG. 2. A rear surface side internal configuration of the electronic key 100 of FIG. 1 is illustrated in FIG. 3. A plan view for explanation on an internal configuration of a receiving antenna 12 is illustrated in FIG. 4. A side view of the receiving antenna 12 is illustrated in FIG. 5. It should be noted that FIG. 2 illustrates the electronic key 190 with a first housing part 61 of a housing 60 being removed. FIG. 3 illustrates the electronic key 100 with a second housing part 62 of the housing 60 being removed and a part of a circuit board 11 being removed. In the followings, for descriptive purpose, a lateral direction of a circuit board 11 is referred to as a X direction, a longitudinal direction of the circuit board 11 is referred to as a Y direction, and a thickness direction of the circuit board 11 is referred to as a Z direction, as shown in FIGS. 1 to 5.

As shown in FIGS. 1 to 3, the electronic key 100 includes a transceiver 10, a battery 30, a switch 40, a key plate 50 and a housing 60. The transceiver 10 transmits and receives electromagnetic wave. The battery 30 supplies driving power to the transceiver 10. The switch 40 is used for issuing an instruction of electromagnetic wave transmission to a microcomputer 14 of the transceiver 10. The key plate 50 is used for locking and unlocking a key of a vehicle in case that signal transmission between a vehicle (not shown) and the electronic key 100 is impossible. The housing 60 receives the key plate 50, the switch 40, the battery 30 and the transceiver 10.

As shown in FIGS. 2 and 3, the transceiver 10 includes a circuit board 11, a receiving antenna 12 for receiving electromagnetic wave in LF (Low Frequency) band, a transmitting antenna 13 for transmitting electromagnetic wave in UHF (Ultra High Frequency) band, and a microcomputer 14 for processing a received signal and controlling the transmission of electromagnetic wave. The transceiver 10 and the microcomputer 14 are mounted to the circuit board 11. Detailed description of the transceiver 10 will be given later.

The battery 30 supplies driving power to the microcomputer 14. In a smart entry system, a signal is transmitted and received multiple times between the vehicle and the electronic key 100 to authenticate the vehicle and the electronic key 100. Thus, it is required to maintain the microcomputer 14 in a driving state at all times, so that the electronic key 100 is ready to process a received signal. The battery 30 can function to maintain the microcomputer 14 in the driving state. As shown in FIG. 3, the battery 30 is attached and fixed to an inner surface of a first housing part 61, which is a component of the housing 60. The battery 30 is electrically connected with a wiring (not shown) of the circuit board 11 via a terminal (not shown).

The switch 40 is used for issuing an instruction of electromagnetic wave transmission to the microcomputer 14. As shown in FIG. 2, the switch 40 is mounted to a front surface 11a of the circuit board 11 and is electrically connected with the microcomputer 14 via a wiring of the circuit board 11.

The key plate 50 is used for locking and unlocking the key of the vehicle in case that the signal transmission between the vehicle and the transceiver 10 is impossible due to, for example, the draining of the battery 30 or an electromagnetic wave environment. As shown in FIGS. 2 and 3, the key plate 50 may be integrated with a holder 63, which is a component of the housing 60.

The housing 60 receives the key plate 50, the switch 40, the battery 30 and the transceiver 10. The housing 60 includes the first housing part 61, the second housing part 62 and the holder 63. The first and second housing parts 61, 62 are engagable with each other. The holder 63 and the key plate 50 are integrally formed (integrated). The first housing part 61 includes a push type button 61a arranged to face the switch 40. The switch 40 is switched on in response to the pushing or pressing of the button 61. The second housing part 62 includes a push type support member 62a. The holder 63 is detachably supported by the support member 62a. The key plate 50 is thus detachably supported by the support member 62a via the holder 63. In response to the pushing or pressing of the support member 62a, fixation of the key plate 50 is released, and the key plate 50 and the holder 63 can be protrudable from the first and second housing parts 61, 62.

Explanation on components of the transceiver 10 is given below. As shown in FIGS. 3 and 4, the receiving antenna 12 is mounted to a rear surface 11b of the circuit board 11. The receiving antenna 12 includes: three coil antennas 15 to 17; a supporter 18; and a case 19 for receiving the coil antennas 15 to 17 and the supporter 18. Each coil antenna 15 to 17 includes a thin wire wound around the supporter 18. Axis directions, around which the thin wires are spirally wound, of respective coil antennas 15 to 17 are different from each other. Eight terminals 20a to 20h connected with the wiring of the circuit board 11 are disposed on the supporter 18. As shown in FIG. 3, the terminals 20a to 20h are arranged on side surfaces 19a to 19d of the case 19. Note that the side surfaces 19a to 19d are respectively parts of an outer surface of the case 19. More specifically, the terminals 20a and 20b are arranged on the side surface 19a, and the terminals 20c and 20d are arranged on the side surface 19b, and the terminals 20e and 20f are arranged on the side surface 19c, and the terminals 20g and 20h are arranged on the side surface 19d. The terminals 20a and 20b are respectively connected with ends of the coil antenna 15, and the terminals 20c and 20d are respectively connected with ends of the coil antenna 16, and the terminals 20e and 20f are respectively connected with ends of the coil antenna 17. Because of the above structure, the coil antennas 15 to 17 are electrically connected with the microcomputer 14 via the terminals 20a to 20f and the wiring of the circuit board 11. As shown in FIG. 4, the axis direction of the coil antenna 15 is parallel to the X direction, and the axis direction of the coil antenna 16 is parallel to the Y direction, and the axis direction of the coil antenna 17 is parallel to the Z direction. According to the above structure, the coil antennas 15 to 17 can receive the electromagnetic wave incident in X, Y and X directions. When the coil antennas 15 to 17 receive the electromagnetic wave, the electromagnetic induction causes the coil antennas 15 to 17 to output currents that depend on the received electromagnetic wave. The currents generated due to the electromagnetic induction are inputted to the microcomputer 14 via the terminals 20a to 20f and the wiring of the circuit board 11. The microcomputer 14 analyzes information contained in the inputted current, and supplies a current to the transmitting antenna 13 via the wiring of the circuit board 11, the terminals 20g and 20h based on the analyzed information. In the above structure, the terminals 20a to 20f are an example of multiple first terminals. The terminals 20g and 20h are an example of two second terminals. The side surfaces 19a to 19d are an example of an outer surface of the case 19. Further, the side surfaces 19a and 19c are an example of a first outer surface part or a first side surface part, which faces the key plate 50. The side surfaces 19b and 19d are an example of a second outer surface part or a second side surface part, which is different from the first outer surface part or the first side surface part.

As shown in FIG. 5, the transmitting antenna 13 of the present embodiment includes a wiring pattern 21, which is patterned in U-shape on the side surface 19d. The wiring pattern 21 includes two vertical parts 22 each extending in the Z direction and a horizontal part 23 extending in the X direction. For illustrative purpose, the two vertical parts 22 are also referred to as a first vertical part 22 and a second vertical part 22. An end of the first vertical part 22 is electrically connected with the terminal 20g, and another end of the first vertical part 22 is electrically connected with an end of the horizontal part 23. An end of the second vertical part 22 is electrically connected with the terminal 20h, and another end of the second vertical part 22 is electrically connected with another end of the horizontal part 23. When a current is supplied to the wiring pattern 21 of the transmitting antenna 13 via the wiring of the circuit board 11 and the terminals 20g, 20h, a current flows in the vertical parts 22 and the horizontal part 23. Then, a polarized wave having a polarization plane parallel to the Z direction is transmitted from the vertical part 22. A polarized wave having a polarization plane parallel to the X direction is transmitted from the horizontal part 23.

Explanation is given below on a smart entry system including the electronic key 100 of the present embodiment. The smart entry system performs authentication of a vehicle and the electronic key 100 through multiple signal transmissions between the vehicle and the electronic key 100. From the vehicle in a parked state, a first request signal requesting a response is cyclically transmitted. When the electronic key 100 is placed in a detectable range where the electronic key 100 can detect the first request signal, the signal transmission is performed between the vehicle and the electronic key 100.

When the electronic key 100 receives the first request signal requesting a response, the electronic key 100 transmits a first response signal as the response to the first request signal. When the vehicle receives the first response signal, the vehicle transmits a second request signal to the electronic key 100. The second request signal, includes a request for ID cross-checking between an ID assigned to the electronic key 100 and that assigned to the vehicle. When the electronic key 100 receives the second request signal, the electronic key 100 cross-checks the ID assigned thereto with the ID assigned to the vehicle. When the IDs match each other, the electronic key 100 transmits a second response signal. When the vehicle receives the second response signal, the vehicle transmits a third request signal to the electronic key 100. The third request signal contains a plain text. When the electronic key 100 receives the third request signal, the electronic key 100 encrypts the plain text contained in the third request signal and transmits a third response signal to the vehicle. The third response signal contains the ID of the electronic key 100 and the encrypted plain text. When the vehicle receives the third response signal, the vehicle decrypts the encrypted plain text contained in the third response signal, and cross-checks the decrypted plain text with the plain text contained in the third request signal. When the plain texts do not mach each other, the vehicle again transmits the first request signal. When the plain texts mach each other, it is determined that the authentication of the vehicle and the electronic key 100 is successful. When the authentication is successful, the vehicle switches into a key lock/unlock preparation state. When a signal containing a command to lock/unlock the key is outputted from a door handle of the vehicle to an ECU of the vehicle in the key unlock preparation state, the key is locked/unlocked. As seen from above, the smart entry system of the present embodiment performs the authentication of the vehicle and the electronic key 100 through double-checking, i.e., cross-checking IDs and matching plain-texts.

Explanation is given below on unpredictable advantages of the electronic key 100 of the present embodiment. According to the present embodiment, the transmitting antenna 13 is formed not on the circuit board 11 but on the case 19. Thus, size of the circuit board 11 of the electronic key 100 can be reduced by a mounting surface for the transmitting antenna, compared to a comparison-example structure where a transmitting antenna and a receiving antenna are mounted on a circuit board and spaced apart from each other.

Further, according to the present embodiment, since the transmitting antenna 13 is formed on the case 19 of the receiving antenna 12, it is possible to simplify a assembling process of mounting the transmitting antenna 13 and the receiving antenna 12 to the circuit board 11, compared to a comparison-example structure where the transmitting antenna 13 and the receiving antenna 12 is provided separately from each other.

Further, according to the present embodiment, when the current flows in the vertical parts 22 and the horizontal part 23 of the wiring pattern 21 of the transmitting pattern 13, a first polarized radio wave and a second polarized radio wave are transmitted such that the first polarized radio wave has a polarization plane parallel to the X direction and the second radio wave has a polarization plane parallel to the Y direction. Since the transmitting antenna 13 transmits two polarized radio waves whose polarization planes are perpendicular to each other, it is possible to reduce an influence of multipath in radio wave transmission.

Further, according to the present embodiment, the receiving antenna 12 includes the coil antennas 15 to 17, the supporter 18, and the case 19 receiving the coil antennas 15 to 17 and the supporter 18. Thus, the case 19 can protect the coil antennas 15 to 17 having the wound thin wires.

According to the present embodiment, the receiving antenna 12 receives the electromagnetic wave in LF band, and the transmitting antenna 13 transmits the electromagnetic wave in UHF band. According to this configuration, it is possible reduce an electromagnetic wave influence on a human body of a user carrying the electronic key 100, compared to an comparison-example case where the UHF band is employed as the frequency band of the electromagnetic wave received by the receiving antenna 12. Further, it is possible to increase a radio wave reachable distance of the electromagnetic wave transmitted from the transmitting antenna 13, compared to a comparison-example case where the LF band is employed as the frequency band of the electromagnetic wave transmitted from the transmitting antenna 13.

According to the present embodiment, the wiring pattern 21 is formed on the side surface 19d, which is located distant from the key plate 50 more than the side surface 19a, 19b. According to this structure, a distance between the wiring pattern 21 and the key plate 50 becomes larger compared to a comparison example case where the wiring pattern 21 is formed on the side surface 19a or 19b. It is thus possible to suppress influence of the key plate 50 on the electromagnetic wave transmission from the wiring pattern 21. It is possible to suppress a bias of directionality of electromagnetic wave transmitted from the wiring pattern 21, the bias being caused by the key plate 50 collecting a magnetic flux of the electromagnetic wave.

The above embodiment can be modified in various ways, examples of which are described below.

In the above embodiment, the transmitting antenna 13 is formed on the case 19. Alternatively, the transmitting antenna 13 may be formed as a metal plate having a U-shape. In this structure, ends of the metal plate may be respectively mounted to the terminals 20g, 20h such that the metal plate is in a standing position with respect to the surface of the circuit board 11. According to the above alternative structure, since the transmitting antenna 13 is not mounted to the circuit board 11 but to the terminals 20g, 20h, size of the circuit board 11 of the electronic key 100 can be reduced by a mounting surface for the transmitting antenna 13, compared to a comparison-example structure where a transmitting antenna and a receiving antenna are mounted on a circuit board and spaced apart from each other. When the above alternative structure is employed, an assembling process of mounting the transmitting antenna 13 to the terminals 20g and 20h may be performed after a process of mounting the receiving antenna 12 to the circuit board 11.

According to the above embodiment, the wiring pattern 21 is located on the side surface 19d. However, location of the wiring pattern 21 may not limited to the side surface 19d. For example, the wiring pattern 21 may be located on the side surface 19b. As shown in FIG. 19b, since the side surface 19b is located distant from the key plate 50 compared to the side surfaces 19a and 19c, a distance between the wiring pattern 21 and the key plate 50 can be larger compared to a comparison example case where the wiring pattern 21 is formed on the side surface 19a or 19c. According to the above alternative structure, it is also possible to suppress an influence of the key plate 50 on the electromagnetic wave transmission from the wiring pattern 21. It is possible to suppress bias of directionality of electromagnetic wave transmitted from the wiring pattern 21, the bias being caused by the key plate 50 collecting a magnetic flux of the electromagnetic wave.

The above embodiments and modifications have the following aspects.

According to a first aspect, a transceiver is provided. The transceiver includes a circuit board, a receiving antenna and a transmitting antenna. The receiving antenna is mounted to the circuit board and configured to receive a first electromagnetic wave in a first frequency band. The receiving antenna includes: a supporter; multiple coil antennas each having a coil wound around the supporter, axis directions of the multiple coil antennas being perpendicular to each other; multiple first terminals arranged on the supporter and connected with a wiring of the circuit board, the multiple first terminals being respectively connected with the multiple coil antennas; and two second terminals arranged on the supporter and connected with the wiring of the circuit board. The transmitting antenna is mounted to the receiving antenna and configured to transmit a second electromagnetic wave in a second frequency band. The transmitting antenna includes: a horizontal part extending in a direction perpendicular to a thickness direction of the circuit board; and two vertical parts each extending in the thickness direction of the circuit board and including a first vertical part and a second vertical part. One end of the first vertical part is connected with one of the two second terminals and another end of the first vertical part is connected with one end of the horizontal part. One end of the second vertical part is connected with the other of the two second terminals and another end of the second vertical part is connected with another end of the horizontal part.

The above transceiver may be configured such that: the receiving antenna further includes a case that receives the multiple plurality of coil antennas and the supporter; and the transmitting antenna is a wiring pattern formed on an outer surface of the case. Alternatively, the above transceiver may be configured such that the transmitting antenna is a U-shaped metal plate.

The above transceiver may be configured such that the first frequency band is a LF band and the second frequency band is a UHF band.

According to a second aspect, there is provided n electronic key that includes the transceiver according to the first aspect. The receiving antenna of the electronic key may further include a case that receives the multiple coil antennas and the supporter, and that has an outer surface including a first outer surface part and a second outer surface part. The electronic key may further include a key plate that is provided to face the first outer surface part of the case. Two second terminals and the transmitting antenna are mounted to the second outer surface part of the case.

According to a third aspect, there is provided an electronic key for locking and unlocking a key of a vehicle. The electronic key includes: a housing; a key plate that is receivable in the housing and protrudable from the housing such that the key plate protruding from the housing is insertable into the key of the vehicle to lock and unlock the key of the vehicle; and a transceiver that is received in the housing and is wirelessly communicatable with the vehicle to lock and unlock the key of the vehicle. The transceiver includes: a circuit board; a case that has an outer surface including a first side surface part and a second side surface part, wherein the case is mounted to the circuit board such that a distance between the key plate and the first side surface part is smaller than that between the key plate and the second side surface part; a receiving antenna that is formed as a coil antenna arranged inside the case, the receiving antenna being configured to receive electromagnetic wave from the vehicle; and a transmitting antenna that is formed as a U-shaped wiring pattern arranged on the second side surface part of the case, wherein the transmitting antenna includes a horizontal part and a vertical part, wherein the transmitting antenna is configured to send the electromagnetic wave to the vehicle by transmitting a first polarized radio wave from the horizontal part and a second polarized radio wave from the vertical part, such that a polarization plane of the first polarized radio wave is perpendicular to that of the second polarized radio wave.

While the invention has been described above with reference to various embodiments thereof, it is to be understood that the invention is not limited to the above described embodiments and constructions. The invention is intended to cover various modifications and equivalent arrangements. In addition, while the various combinations and configurations described above are contemplated as embodying the invention, other combinations and configurations, including more, less or only a single element, are also contemplated as being within the scope of embodiments.

What is claimed is:

1. An electronic key comprising
a transceiver comprising:
a circuit board;
a receiving antenna that is mounted to the circuit board and configured to receive a first electromagnetic wave in a first frequency band, wherein the receiving antenna includes:
   a supporter;
   a plurality of coil antennas each having a coil wound around the supporter, axis directions of the plurality of coil antennas being perpendicular to each other;
   a plurality of first terminals arranged on the supporter and connected with a wiring of the circuit board, the plurality of first terminals being respectively connected with the plurality of coil antennas; and
   two second terminals arranged on the supporter and connected with the wiring of the circuit board; and
a transmitting antenna that is mounted to the receiving antenna and configured to transmit a second electromagnetic wave in a second frequency band, wherein the transmitting antenna includes:
   a horizontal part extending in a direction perpendicular to a thickness direction of the circuit board; and
   two vertical parts each extending in the thickness direction of the circuit board and including a first vertical part and a second vertical part, wherein one end of the first vertical part is connected with one of the two second terminals and another end of the first vertical part is connected with one end of the horizontal part, wherein one end of the second vertical part is connected with the other of the two second terminals and another end of the second vertical part is connected with another end of the horizontal part; the electronic key further comprising:

a key plate, wherein:

the receiving antenna further includes a case that receives the plurality of coil antennas and the supporter;

the case has an outer surface including a first outer surface part and a second outer surface part;

the key plate is provided to face the first outer surface part of the case; and the two second terminals and the transmitting antenna are mounted to the second outer surface part of the case.

2. An electronic key for locking and unlocking a key of a vehicle, comprising:

a housing;

a key plate that is receivable in the housing and protrudable from the housing, wherein the key plate protruding from the housing is insertable into the key of the vehicle to lock and unlock the key of the vehicle; and a transceiver that is received in the housing and is wirelessly communicatable with the vehicle to lock and unlock the key of the vehicle, wherein the transceiver includes:

a circuit board;

a case that has an outer surface including a first side surface part and a second side surface part, wherein the case is mounted to the circuit board such that a distance between the key plate and the first side surface part is smaller than that between the key plate and the second side surface part;

a receiving antenna that is formed as a coil antenna arranged inside the case, the receiving antenna being configured to receive electromagnetic wave from the vehicle; and a transmitting antenna that is formed as a U-shaped wiring pattern arranged on the second side surface part of the case, wherein the transmitting antenna includes a horizontal part and a vertical part, wherein the transmitting antenna is configured to send the electromagnetic wave to the vehicle by transmitting a first polarized radio wave from the horizontal part and a second polarized radio wave from the vertical part, such that a polarization plane of the first polarized radio wave is perpendicular to that of the second polarized radio wave.

* * * * *